(12) United States Patent
Edwards (10) Patent No.: US 7,296,168 B2
(45) Date of Patent: Nov. 13, 2007

(54) METHOD AND APPARATUS TO MINIMIZE POWER AND GROUND BOUNCE IN A LOGIC DEVICE

(75) Inventor: Darvin R. Edwards, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 420 days.

(21) Appl. No.: 11/008,341

(22) Filed: Dec. 9, 2004

(65) Prior Publication Data

US 2005/0132243 A1  Jun. 16, 2005

Related U.S. Application Data

(60) Provisional application No. 60/529,072, filed on Dec. 13, 2003.

(51) Int. Cl.
*G06F 1/26* (2006.01)
(52) U.S. Cl. .................. 713/320; 713/300; 713/330; 323/204
(58) Field of Classification Search ................ 713/300, 713/320, 340, 330; 323/205
See application file for complete search history.

(56) References Cited

U.S. PATENT DOCUMENTS

| 5,083,187 | A | | 1/1992 | Lamson et al. | |
|---|---|---|---|---|---|
| 5,701,071 | A | * | 12/1997 | Liou et al. | 323/220 |
| 6,184,703 | B1 | * | 2/2001 | Vest et al. | 326/27 |
| 6,188,205 | B1 | * | 2/2001 | Tanimoto et al. | 323/205 |
| 6,366,114 | B1 | * | 4/2002 | Liu et al. | 326/27 |
| 7,162,655 | B2 | * | 1/2007 | McDonald et al. | 713/320 |
| 2002/0065049 | A1 | | 5/2002 | Chauvel et al. | |
| 2003/0079150 | A1 | * | 4/2003 | Smith et al. | 713/320 |
| 2003/0171909 | A1 | * | 9/2003 | Inomoto et al. | 703/23 |

OTHER PUBLICATIONS

Christopher W. Zell and Douglas J. Hamilton, "A Simple Simultaneous Switching Noise (SSN) Modeling and Simulation Methodology", Jul. 1996, pp. 129-131, IEEE.

Arun Vaidyanath and J.L. Prince, "Influence of Parameter Distribution on Simultaneous Switching Noise (SSN) for CMOS Output Drivers", Jan. 1994, pp. 33-38, IEEE.

* cited by examiner

*Primary Examiner*—Thomas Lee
*Assistant Examiner*—Malcolm D Cribbs
(74) *Attorney, Agent, or Firm*—Robert D. Marshall, Jr.; W. James Brady, III; Frederick J. Telecky, Jr.

(57) ABSTRACT

A predictive power regulation apparatus and method that minimizes power and ground bounce in a logic device. The apparatus includes a predictor and a voltage or current smoothing device connected to the predictor. The voltage or current smoothing device outputs adjusted voltage or current to power and ground planes of the logic device. In one embodiment, the predictor includes an instruction scanner device and a look-up table connected to the instruction scanner device. The instruction scanner device determines the next instruction to be executed by the logic device. A voltage/current scheduling buffer connected to the look-up table contains voltage and current compensation and the time at which the voltage or current compensation should be requested from the voltage or current smoothing device. An alternative predictive power regulation apparatus is described that reduces power and ground bounce caused by the I/O buffer circuitry switching in the logic device.

35 Claims, 6 Drawing Sheets

METHOD AND APPARATUS TO MINIMIZE POWER AND GROUND BOUNCE IN A LOGIC DEVICE

This application claims priority under 35 USC § 119(e)(1) of Provisional Application No. 60/529,072, filed Dec. 13, 2003.

FIELD OF THE INVENTION

The present invention generally relates to reducing voltage swing in integrated circuits. More particularly, the invention relates to minimizing voltage fluctuations on the power and ground planes of integrated circuit chips. Still more particularly, the invention relates to predicting the voltage or current needed at a future time by a processor in order to minimize voltage bounce on the power and ground planes.

BACKGROUND OF THE INVENTION

Logic devices such as digital signal processors, microprocessors, programmable circuit devices, and Application Specific Integrated Circuits (ASICs) contain many millions of transistors switching at very high frequencies. Such devices consume large amounts of power, requiring 200 watts or more. Power P may be defined as the voltage V between the power and ground buses of a logic device multiplied by the current I entering the logic device through the power bus and exiting the logic device through the ground bus, P=V×I. The logic device is contained in a logic device package that contains power and ground planes that connect logic device power and ground buses to the power supply. The logic device power and ground buses provide voltage and current to the subcircuits within the logic device. At any given time, the logic device through the power and ground planes and buses may draw many amperes of current from the power supply at high voltages.

Software instructions executing on the logic device can cause vast swings in the current needed by the logic device. Depending on the instruction, whole subcircuits in the logic device may turn on or off, creating large shifts in the current through the power and ground planes and buses. As a result of the resistance and inductance in the power and ground planes and buses, these large current draws can result in voltage noise that can lead to malfunction of the logic device. Such voltage noise on the power and ground planes and buses is generally known as power bounce or ground bounce.

Voltage bounce on the power and ground planes and buses may also be caused by the switching of high speed input/output (I/O) buffer circuitry in the logic device as described by Christopher W. Zell and Douglas J. Hamilton, "A Simple Simultaneous Switching Noise (SSN) Modeling and Simulation Methodology," *IEEE 5th Topical Meeting of Electrical Performance of Electronic Packaging*, pp. 129-131, Oct. 28-30, 1996. I/O buffer circuitry sends and receives signals between the logic device and other integrated circuit devices on a circuit board. The I/O buffer circuitry must be able to switch from a high state to a low state and from a low state to a high state at very high speeds. The high state and low state may represent binary values of one and zero, respectively. Large transistors capable of driving high currents for high speed signal transmission and switching are present in the I/O buffer circuitry. As the switching speed is increased more and more by increasing the clock speed and transition rate of the I/O buffer circuitry, more voltage bounce is generated.

Bounce on the power and ground planes and buses in a logic device may be reduced in a variety of ways. Bypass capacitors are commonly used to decouple the power and ground planes. Such bypass capacitors are very effective for low currents and for frequencies up to about 1 GHz. However, high performance logic devices such as microprocessors may require upwards of 30 amperes of current for various subsystems. Such high currents and corresponding voltages cannot easily be filtered by the bypass capacitors to minimize power and ground bounce.

Power and ground bounce may also be reduced by distributing multiple power and ground planes and buses over different areas of the logic device and package. Power and ground bounce caused by the I/O buffer circuitry may be reduced by placing the circuitry near bonding pads along the edge of the logic device to reduce the length of current travel and thus reduce inductance. Short wire bonds connecting the logic device bonding pads to lead fingers on the circuit board may further reduce power and ground bounce caused by the inductance of the wire bonds. Flip chip packaging technology may also be used to minimize power and ground bounce. Improved I/O buffer circuitry switching at different times may also reduce power and ground bounce. The techniques described above require complex and time consuming design of the logic device circuitry and do not eliminate the power and ground bounce. Thus, there has been a longfelt need for an improved method and apparatus to minimize power and ground bounce in the logic device.

SUMMARY OF THE INVENTION

The problems noted above are solved in large part by a predictive power regulation apparatus operatively arranged to minimize power and ground bounce in a logic device. The predictive power regulation apparatus includes at least one instruction buffer coupled to a predictor. The predictor connects to a smoothing device that may be a current smoothing device or a voltage smoothing device. In some embodiments of the invention, the voltage smoothing device includes at least one voltage regulator with a summing circuit and a direct current (DC) power supply connected to the voltage regulator(s). In some alternative embodiments of the invention, the voltage smoothing device is a variable voltage power supply.

Alternatively, in one embodiment of the invention, a current smoothing device includes at least one current regulator with a summing circuit and a DC power supply connected to the current regulator(s). The current smoothing device, alternatively, may be a variable current power supply. The current smoothing device provides adjusted current to power and ground planes of the logic device. The logic device may be a microprocessor, digital signal processor, programmable circuit, or Application Specific Integrated Circuit (ASIC). The logic device may be contained in a flip chip-ball grid array package or a plastic ball grid array package. The current or voltage regulators may be adjacent to the logic device in the package.

An instruction scanner device and a look-up table connected to the instruction scanner device are included in the predictor. The instruction scanner device determines the next instruction to be executed by the logic device. The look-up table receives assembly language instructions from the instruction scanner and determines voltage compensation or current compensation for each instruction. A voltage/current scheduling buffer connected to the look-up table contains the voltage compensation or current compensation and time the voltage or current compensation should be requested from the voltage smoothing device or current smoothing device. The look-up table provides the voltage or current compensation to the voltage/current scheduling buffer.

Power and ground bounce in a logic device is minimized as a result of the predictor predicting the next instruction to be executed by the logic device from a list of assembly language instructions in a first-in-first-out (FIFO) instruction buffer. Predicting the next instruction to be executed by the logic device includes examining instructions below the top instruction of the FIFO buffer. In some embodiments of the invention, the look-up table determines a current requirement of the logic device to execute the instruction. The current smoothing device adjusts current on the power and ground planes of the logic device to the determined value during execution of the instruction. The current on the power and ground planes of the logic device is adjusted by increasing the current to the determined value at start of instruction execution. The current on the power and ground planes of the logic device is adjusted by decreasing the current to its steady state value corresponding to voltage $V_{dd}$ after completion of instruction execution.

Determining the current requirement of the logic device to execute the instruction includes receiving the predicted next instruction to be executed, finding the instruction in a look-up table, and determining the current requirement of the instruction from the look-up table.

A predictive power regulation apparatus is described that reduces power and ground bounce caused by the I/O buffer circuitry switching in the logic device. The apparatus includes a data storage device connected to the I/O buffer circuitry and a predictor connected to the data storage device. The data storage device may be a shift register. The apparatus also includes a voltage or current smoothing device connected to the predictor, the voltage or current smoothing device providing adjusted voltage or current to power and ground planes of the logic device.

The predictive power regulation apparatus can minimize power and ground bounce in a logic device by predicting the next state of input/output buffer circuitry in the logic device. In some embodiments of the invention, the apparatus determines a current requirement of the logic device to switch the I/O buffer circuitry to its next state. After determining the current requirement, the apparatus adjusts current on the power and ground planes of the logic device to the required current during switching of the I/O buffer circuitry to its next state. The current on the power and ground planes of the logic device is adjusted by increasing or decreasing the current to the determined value at start of switching of the I/O buffer circuitry to its next state. The current on the power and ground planes of the logic device is adjusted by holding the current at a steady state value corresponding to voltage $V_{dd}$ after the input/output buffer circuitry has completed switching to its next state.

In some embodiments of the invention, predictive power regulation may be used in combination with bypass capacitors to supply clean voltage and current on the power and ground planes.

A method of minimizing power and ground bounce in a logic device is described that includes predicting from a list of instructions in a buffer the next instruction to be executed by the logic device. The logic device contains power and ground planes. A current requirement of the logic device to execute the instruction is determined. The current on the power and ground planes of the logic device is adjusted to the determined current requirement for executing the instruction.

Another method of minimizing power and ground bounce in a logic device is described that includes predicting the next state of input/output buffer circuitry in a logic device. The logic device includes power and ground planes. A current requirement of the logic device to switch the input/output buffer circuitry to its next state is determined. The current on the power and ground planes of the logic device is adjusted to the determined value for switching the input/output buffer circuitry to its next state.

The present invention provides significant advantages over the prior art. One advantage is a clean power and ground voltage and current that minimizes error on the logic device. Thus, a new package structure with increased bypass capacitance and low inductive load close to the logic device is not needed for reducing power and ground bounce. Another advantage is that the apparatus and method can be used with logic devices of any number of transistors and power consumption without significant redesign of the logic device and the apparatus and method itself.

BRIEF DESCRIPTION OF THE DRAWINGS

The embodiments of the invention will now be described with reference to the accompanying drawings in which.

DETAILED DESCRIPTION OF THE EMBODIMENTS

Figure 1A:
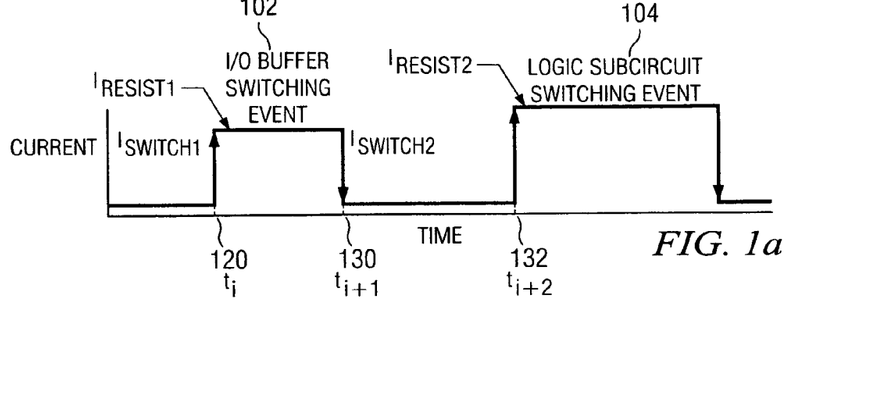
FIG. 1a shows a graph of two current switching events in a logic device.
Figure 1B:
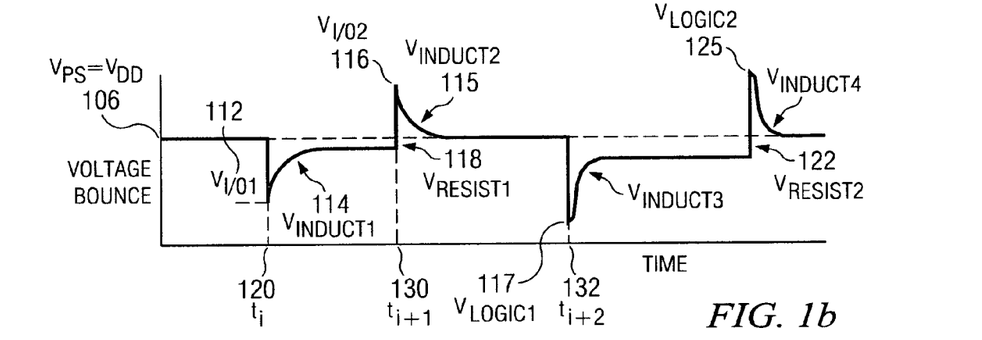
FIG. 1b shows a graph of voltage bounce versus time for a logic device.

FIG. 1a shows a graph of current versus time for two switching events in a logic device. During first switching event 102, I/O buffer circuitry in the logic device switching states from binary zero to one or binary one to zero may cause the current to stay on from $t_i$ 120 to $t_{i+1}$ 130. The rise of the current at $t_i$ 120 and fall of the current at $t_{i+1}$ 130 can result in the voltage bounce shown in FIG. 1b. Second switching event 104, may be caused by the subcircuits of the logic device switching on and off to execute instructions. The rise of the current at time $t_{i+2}$ 132 and fall of the current at $t_{i+3}$ 133 because of subcircuit switching event 104 can also result in voltage bounce as shown in FIG. 1*b*. As shown in FIG. 1*a*, logic subcircuit switching event 104 may require current of a greater magnitude than I/O buffer switching event 102 resulting in the voltage bounce shown in FIG. 1*b* for the logic subcircuit switching event being of greater magnitude than the bounce from the I/O buffer switching event.

As described above, FIG. 1*b* shows the voltage down spike $V_{logic1}$ 117 and up spike $V_{logic2}$ 125 in a logic device caused by instruction execution turning subcircuits in the logic device on and off for switching event 104. FIG. 1*b* also shows a voltage down spike $V_{I/O1}$ 112 and up spike $V_{I/O2}$ 116 caused by the switching of high speed I/O buffer circuitry for the switching event 102. For purposes of explanation, the voltage bounce for the two switching events shown in FIG. 1*b* assumes that the events are separate and not occurring at the same time. However, switching events may occur at the same time or partially overlap causing the bounce of separate switching events to be added or subtracted. For example, the logic device may use both logic subcircuits and I/O buffer circuitry simultaneously to execute the instruction.

The effect on voltage $V_{dd}$ from the power supply $V_{ps}$ 106 on the power plane is shown during the two switching events. As mentioned above, first switching event 102 begins at time $t_i$ 120 and the second switching event 104 begins at time $t_{i+2}$ 132. Logic subcircuit switching event 104 may be caused by execution of instructions by the logic device requiring subcircuits such as register arrays, arithmetic logic functional unit, load/store functional unit, integer add unit, on-chip cache and so on to turn on and off.

As the subcircuits are operating, they draw current $I_{resist2}$ as shown in FIG. 1*a* from the power supply through the power and ground planes of the logic device. The resulting drop in voltage $V_{resist2}$ 122 is caused by the cumulative resistance R of the power plane and buses in the logic device and its packaging and by the resistance of the subcircuits. This is because as current $I_{resist2}$ flows through resistance R, a voltage drop V=I×R that is known as Ohm's law occurs. I/O buffer circuitry in the logic device may send or receive data as part of instruction execution, such as when executing a "move to memory" instruction or "load into register from memory" instruction, or when transferring data to another system component on the circuit board. Thus, the sequence of switching events may occur as shown in FIG. 1*a*—I/O buffer switching event 102 may occur as part of instruction execution followed by execution of the instruction to perform the data move causing logic subcircuit switching event 104. I/O buffer switching event 102 results in voltage drop $V_{resist1}$ 118 as shown in FIG. 1*b* caused by current $I_{resist1}$ flowing through the resistance of the I/O buffer circuitry, power plane and buses.

Voltage spikes caused by inductance of the subcircuits during instruction execution and inductance of I/O buffer circuitry during switching can also contribute substantially to the overall voltage bounce. Inductive voltage bounce is proportional to the rate of change in the current through the subcircuits and I/O buffer circuitry multiplied by the inductance of the subcircuits and I/O buffer circuitry. A slow change in the current results in a small amount of voltage bounce and a fast change in the current results in a large amount of voltage bounce. As shown in FIGS. 1*a*-1*b* for the I/O buffer switching event 102, at time $t_i$ 120 the rise in current $I_{switch1}$ results in a voltage down spike $V_{induct1}$ 114. At time $t_{i+1}$ 130, the downward going $I_{switch2}$ results in a voltage up spike $V_{induct2}$ 115. The inductive portion of the voltage down spike $V_{induct1}$ 114 decays away as soon as current stops changing because inductive voltage bounce is associated with change in current. The voltage loss from the resistance $V_{resist1}$ 118 generally creates more of a flat non-changing drop until the I/O buffer switching event has completed at time $t_{i+1}$ 130 and the I/O buffer circuitry is no longer drawing current. As shown in FIG. 1*b*, inductive voltage loss $V_{induct}$ may be as much as five times greater than the voltage loss caused by resistance $V_{resist}$.

Voltage bounce caused by the resistance and inductance of the logic subcircuits and I/O buffer circuitry can be substantial. For example, if the logic device has a 3 volt rail, meaning that the voltage goes from ground (corresponding to zero volts) to three volts, depending on the design of the chip, the package containing the chip, the I/O buffer circuitry design, and the amount of current drawn into the chip, the voltage bounce may be from 0.5 volts to one volt on the power and ground planes and buses.

Figure 1C:
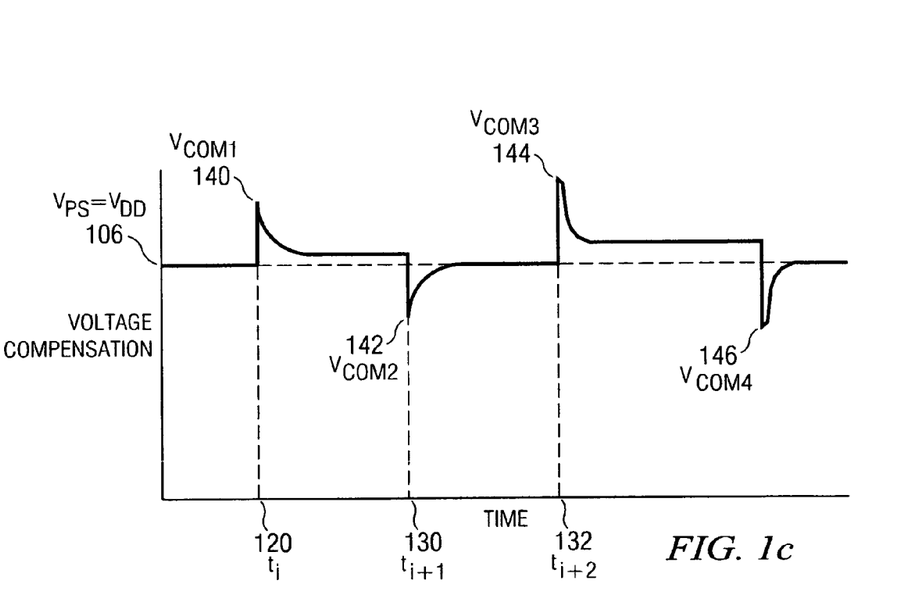
FIG. 1c shows a graph of voltage compensation versus time generated by a voltage or current smoothing device for the voltage bounce shown in FIG. 1b.

FIG. 1*c* shows voltage compensation generated by a voltage or current smoothing device (described in greater detail below) for voltage bounce shown in FIG. 1*b* in accordance with some embodiments of the invention. In one embodiment of the invention, to eliminate bounce on the power and ground planes and buses on the logic device and logic device package, the smoothing device overshoots or undershoots the voltage rail and drives more current to the logic device. The voltage or current smoothing device generally regulates the voltage at a constant value of $V_{ps}=V_{dd}$ 106 until the logic device begins I/O buffer switching event 102 at time $t_i$ 120 as shown in FIG. 1*a*. At time $t_i$ 120 the voltage or current smoothing device boosts the voltage or current to create a voltage up spike with maximum value $V_{com1}$ 140 and same general shape of the spike shown in FIG. 1*b* but opposite magnitude. At time $t_{i+1}$ 130 the voltage or current smoothing device lowers the voltage or current to create a voltage down spike with maximum value $V_{com2}$ 142 and same general shape of the spike at time $t_{i+1}$ 130 shown in FIG. 1*b* but opposite magnitude. Similarly for switching event 104, the voltage or current smoothing device at time $t_{i+2}$ 132 boosts the voltage or current to create the voltage up spike with maximum value $V_{com3}$ 144 and opposite magnitude to the spike shown in FIG. 1*b*. The general shape and timing of the compensation voltages shown in FIG. 1*c* should be similar to the voltage bounce shown in FIG. 1*b* but rotated about the $V_{ps}$ axis.

Figure 2:
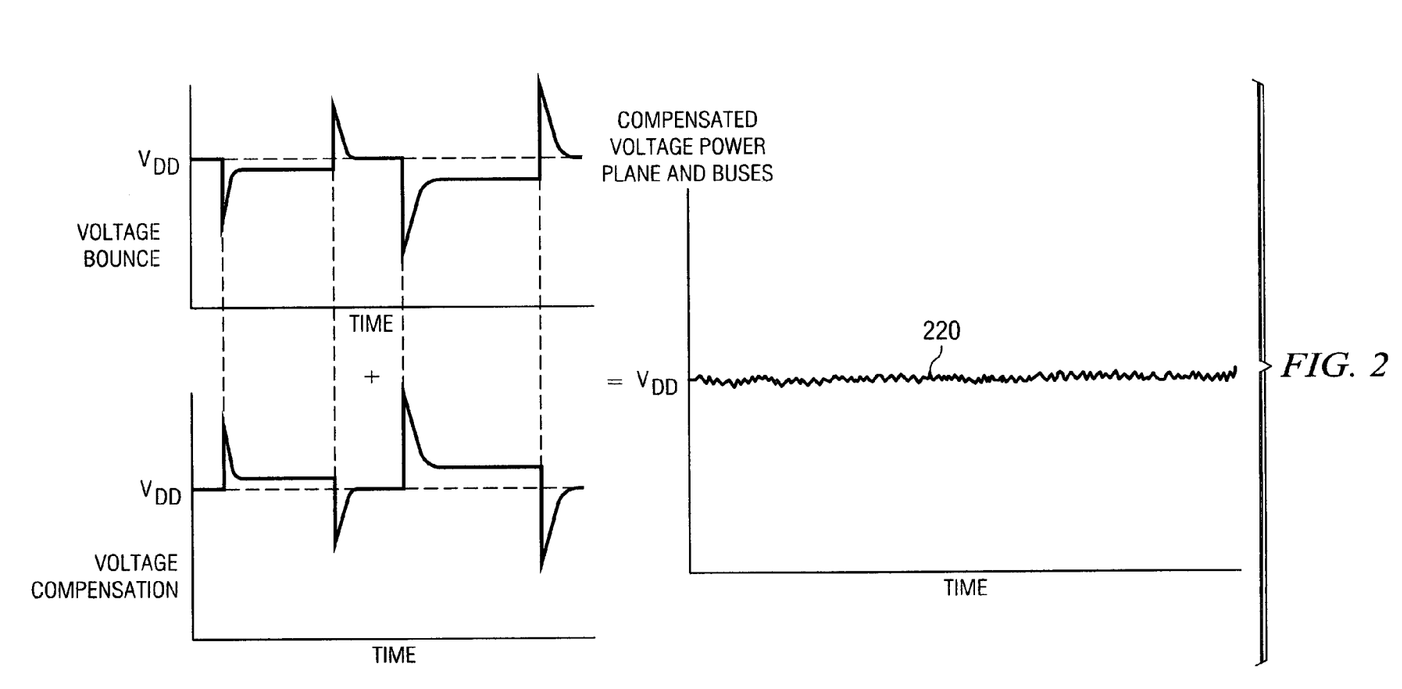
FIG. 2 shows cancellation of the voltage bounce shown in FIG. 1b by the voltage compensation shown in FIG. 1c to generate clean voltage at power plane.

Turning now to FIG. 2, cancellation of the voltage bounce shown in FIG. 1*b* by the voltage compensation shown in FIG. 1*c* to generate a "clean" voltage 220 at power plane and buses is shown. The graphs for voltage bounce and voltage compensation for ground plane and buses is similar to the graphs shown in FIGS. 1*b* and 1*c* for power plane and buses but shifted down to a lower voltage value. As the logic device performs a switching event, the voltage or current smoothing device boosts or lowers the power and ground plane voltages or currents in sequence with the time dependent voltage plot of the voltage bounce. The resulting cancellation of the voltage bounce by the voltage or current compensation generates a "clean" voltage 220. The "clean" voltage 220 may still contain low amplitude, high frequency noise that can be filtered by bypass capacitors as described above.

Figure 3:
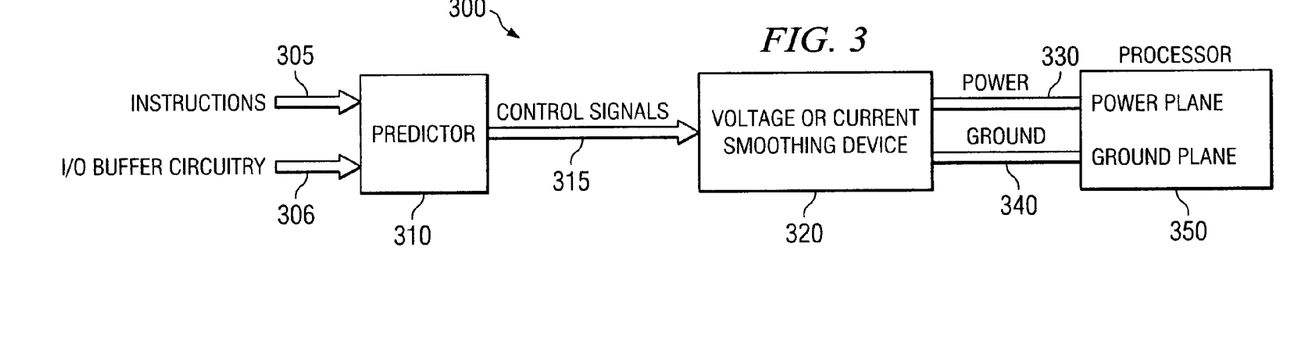
FIG. 3 is a block diagram of a voltage or current compensation device connected to the power and ground planes of a processor in accordance with some embodiments of the invention.

Referring to FIG. 3, a block diagram of a voltage/current compensation device 300 connected to the power 330 and ground 340 planes of a logic device that is processor 350 for one embodiment of the invention is shown. A predictor 310 determines the voltage or current compensation for the power and ground planes and buses of processor 350 at a time T prior to processor instruction execution or use of the I/O buffer circuitry. The time T must at least be equal to the inherent delay of the voltage or current smoothing device 320 (the voltage or current smoothing device cannot be programmed to change the voltage or current instantaneously) to generate the required voltage or current at the correct time from the voltage or current smoothing device output. Thus, the predictor 310 communicates to the smoothing device the voltage or current compensation for the next instruction 305 to be executed or for use of I/O buffer circuitry 306 at least a time T prior to the voltage bounce caused by the processor executing the instruction or using the I/O buffer circuitry. In one embodiment of the invention, the voltage or current smoothing device may be a DC voltage or current regulator (not shown in FIG. 3). In an alternative embodiment of the invention, the voltage or current smoothing device may be a variable voltage or current power supply (not shown in FIG. 3). The variable voltage power supply or voltage regulator will generate a voltage waveform as shown in FIG. 1c. The variable current power supply or current regulator will source current of the same shape and magnitude as shown in FIG. 1a to offset the current drawn by the I/O buffer circuitry or logic subcircuits executing instructions. The current sourced by the variable current power supply or current regulator will interact with the I/O buffer circuitry or logic subcircuits resistance and inductance resulting in the voltage compensation curve shown in FIG. 1c. The variable voltage or current power supply or voltage or current regulator may have control signals to control the value of the output voltage or current over the range needed for voltage or current compensation of the bounce on the power and ground planes and buses. The control signals 315 as shown in FIG. 3 maybe output from the predictor 310 and communicate to the smoothing device 320 the voltage or current compensation for the processor 350 to execute the next instruction or for using the I/O buffer circuitry.

Figure 4:
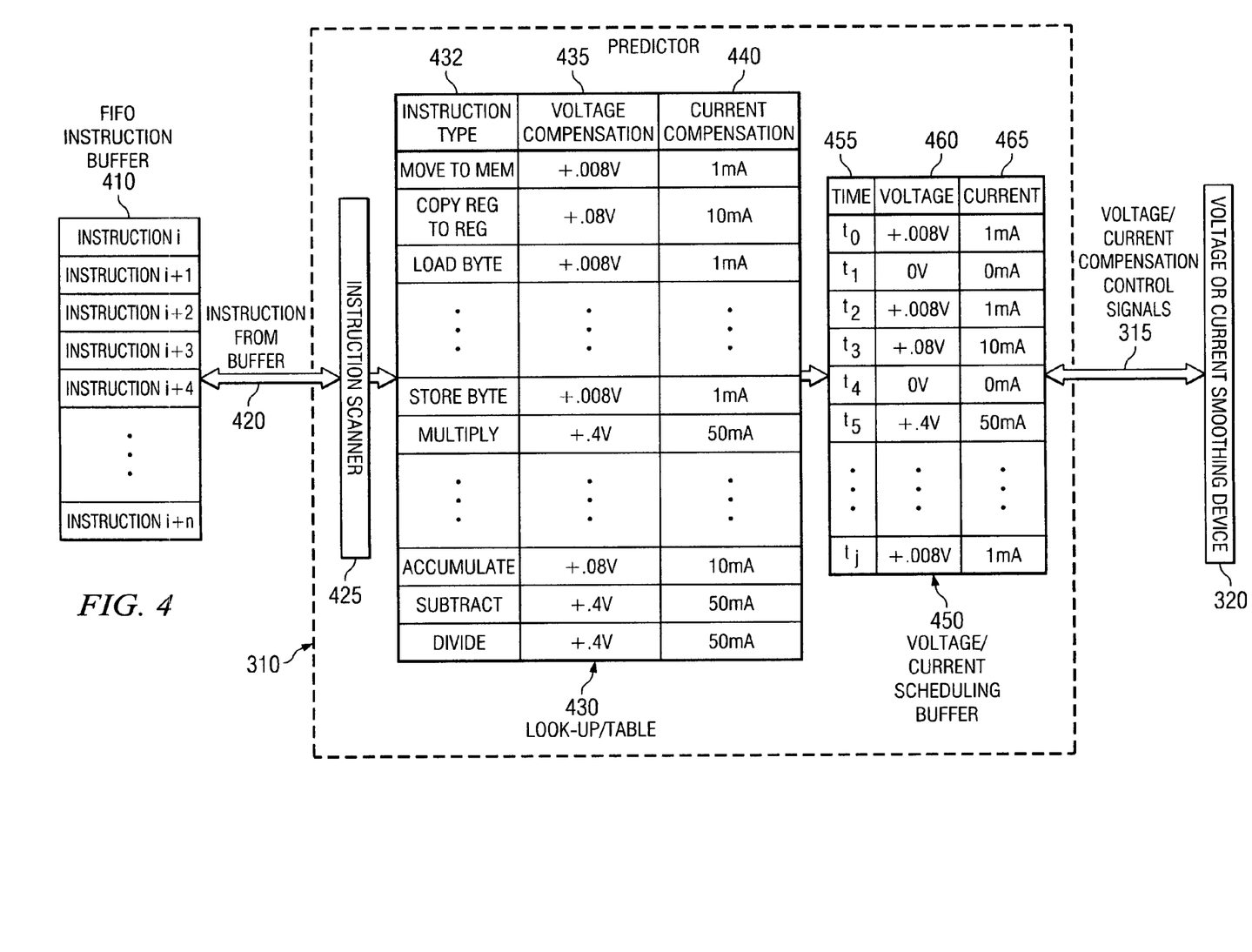
FIG. 4 shows one exemplary embodiment for implementing the predictor of FIG. 3.

Turning now to FIG. 4, one embodiment of the invention for implementing the predictor of FIG. 3 is shown. Software instructions that may be assembly language instructions are generally sequentially executed by the logic device. The assembly language instructions use logic device subcircuits to perform functions such as moving data from memory to a register, multiplying data, performing jumps to other instructions based on if a condition (i.e., contents of a register has a certain value) is true or false, and so on. Some examples of possible assembly language instructions and the functions they perform are given in Table 1 below.

TABLE 1

| Instruction | Function |
|---|---|
| SB | Move Byte to Memory |
| MOVF | Copy One Register to Another Register |
| LB | Load into Register Byte from Memory |
| MULT | Multiply Contents of Two Registers |
| BEQZ | Branch if Register Contains Zero |

Instructions are stored prior to execution by the logic device in a First-In-First-Out (FIFO) instruction buffer 410 as shown in FIG. 4. Each assembly language instruction is retrieved from memory and placed sequentially into the FIFO buffer 410. The instruction at the top of the FIFO buffer 410 is fetched by the logic device, decoded and then executed. Each instruction in the FIFO buffer is fetched, decoded and executed by the logic device until the whole software program is finished executing.

Because of the generally sequential nature of instruction execution, prediction of the next instruction executed by the logic device may be easily performed. Scanning the FIFO buffer to determine the next instruction executed may involve simply looking at instructions below the top instruction. Depending on the design of the processor, instruction execution may be non-sequential if the top instruction in the FIFO buffer is a conditional branch. If the predictor 310 by default takes as executed the next sequential instruction after the conditional branch but the branch is taken so the branch target instruction executed is not sequential to the conditional branch instruction, the predictor can request that the logic device stall execution of the non-sequential branch target instruction to allow the voltage or current smoothing device to generate the proper compensation voltage or current.

The next instructions executed by the logic device as predicted by the predictor may be retrieved from the buffer using sequential prediction as described above. Instruction scanner 425 may then perform a look-up in the look-up table 430 to determine the proper voltage compensation 435 or current compensation 440 for each predicted instruction from the buffer 420. A FIFO voltage/current scheduling buffer 450 may store the voltage compensation 460 or current compensation 465 along with clock cycle lead time 455 that the compensation should be requested from voltage or current smoothing device 320 for each instruction. The clock cycle lead time 455 may be determined by design to release the control signals 315 to the smoothing device 320 slightly earlier than the logic device processes instructions of FIFO instruction buffer 410 to take into account the inherent delay of the smoothing device in generating the voltage or current compensation. Determination of the lead time as described above insures that the compensation voltage or current is provided to the logic device exactly when the logic device needs it.

Look-up table 430 includes instruction types 432 that may be executed by the logic device and the corresponding voltage compensation 435 and current compensation 440 to minimize power and ground bounce. The voltage and current compensation 435, 440 for each instruction in look-up table 430 may be determined during design of the logic device and logic device package by examining the current requirement as shown in FIG. 1a or the voltage bounce shown in FIG. 1b on power and ground planes and buses. For a voltage smoothing device, voltage compensation of opposite magnitude to the voltage bounce may be determined or alternatively if using a current smoothing device a current equal to the maximum current for the switching event (e.g., $I_{resist1}$ for I/O buffer switching event 102, $I_{resist2}$ for logic subcircuit switching event 104) may be determined. Similarly, the clock cycle lead time 455 can be determined during the design of the logic device and is a function of the characteristics of voltage or current compensation circuits in voltage or current smoothing device 320 along with the placement of the compensation circuits with respect to the logic device.

Figure 5:
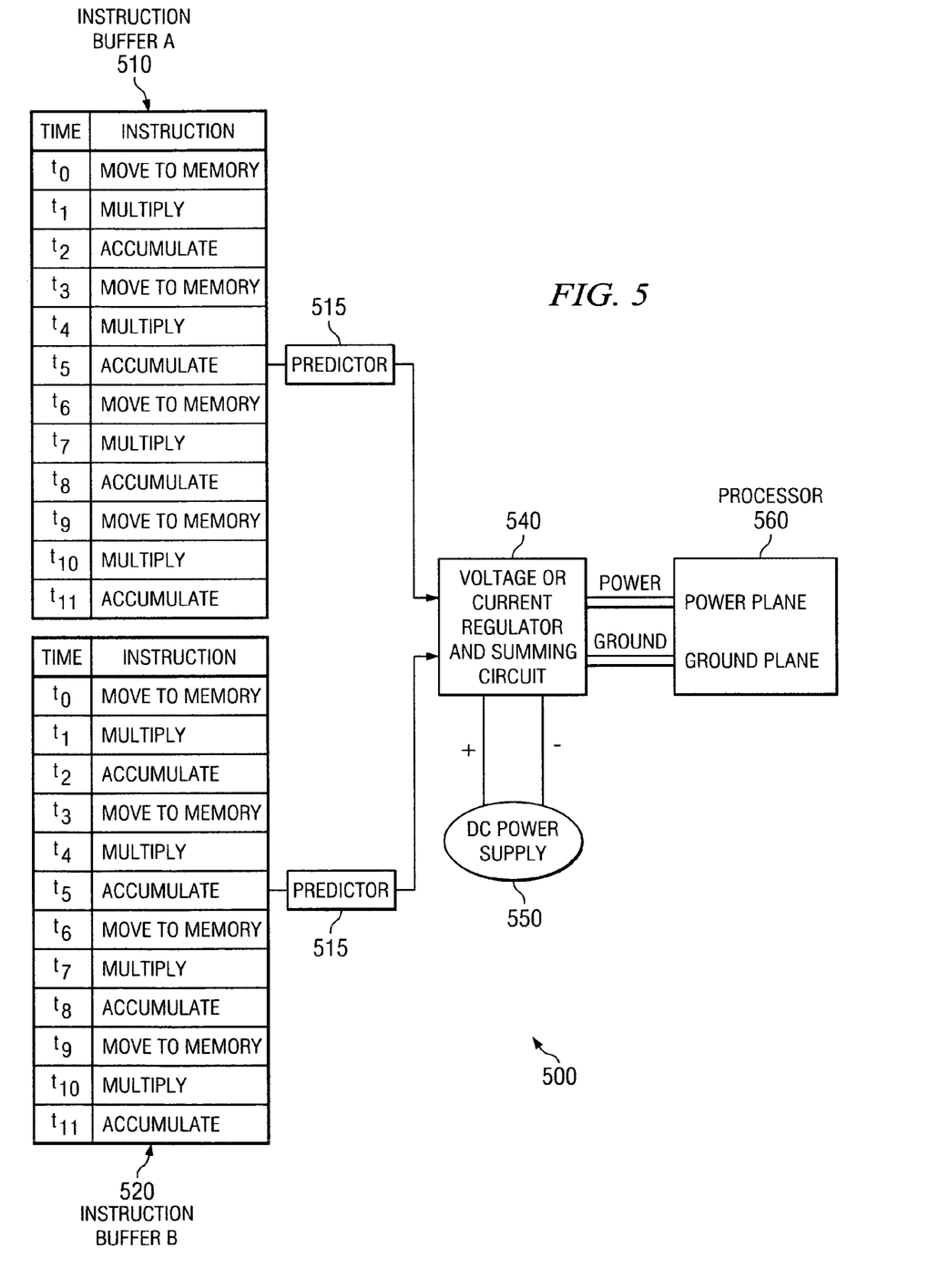
FIG. 5 shows a schematic diagram of a voltage or current compensation device with multiple instruction buffers in accordance with another embodiment of the invention.

Referring to FIG. 5, a schematic diagram of a voltage or current compensation device 500 connected to a processor 560 with multiple instruction buffers 510 and 520 for one embodiment of the invention is shown. Very-Large-Instruction-Word (VLIW) processors can execute multiple instructions in a single clock cycle because of multiple, independent functional units on the processor as described in David A. Patterson, John L. Hennessy, *Computer Architecture A Quantitative Approach*, Morgan Kaufman Publishers, San Mateo, pp 322-325, 1990. For example, the processor may contain multiple arithmetic logic functional units and load/store functional units allowing it to execute multiple instructions simultaneously that each need access to an arithmetic logic unit. To concurrently execute multiple instructions, VLIW processors may contain multiple instruction buffers with separate and independent software programs. The processor may concurrently request instructions from each instruction buffer for parallel execution in its multiple, independent functional units. A processor 560 with multiple instruction buffers A 510 and B 520 is shown in FIG. 5. The voltage bounce on the power and ground planes and buses resulting from multiple instruction execution would be the sum of the voltage bounces from execution of each instruction. To minimize voltage bounce on the power and ground planes and buses of processor 560 capable of concurrently executing multiple instructions, the expected voltage or current compensation needed by the instructions from each instruction buffer should be summed together before being sent to the processor 560. Thus, in the embodiment of the invention shown in FIG. 5, each predictor should scan its corresponding instruction buffer and predict the next instruction to be executed. At a time prior to the processor fetching the instruction for execution in order to compensate for the inherent delay of the voltage or current regulator and summing circuit 540 as described above, the predictor should inform the voltage or current regulator and summing circuit to output the correct voltage or current compensation for the instruction. Both predictors, because the processor is capable of multiple instruction execution, may concurrently request the voltage or current regulator and summing circuit 540 to output compensation voltages or currents, thus causing the voltage or current regulator and summing circuit 540 to add the compensation voltages or currents together.

Predictor circuits 515 may be implemented as described above with reference to FIG. 4. Alternative high performance embodiments of conditional branch handling in the predictor circuit of FIG. 4 may be implemented because the processor shown in FIG. 5 is able to concurrently execute multiple instructions. Thus, for example, if the top instruction in the FIFO instruction buffer A 510 is a conditional branch, instruction buffer A 510 may contain the instructions from one fork of the branch (i.e., if the branch is not taken, the immediate next sequential instructions after the conditional branch) and instruction buffer B 520 may contain the instructions from the other fork of the branch. Since the two forks are loaded into instruction buffer A 510 and instruction buffer B 520, predictor 515 may determine the next instructions to be executed by the processor 560 and their corresponding voltage and current compensation. Thus, once the conditional branch is executed by the processor 560, and the correct fork to continue instruction execution is determined, the instruction buffer with the not taken fork instructions is emptied. Concurrently, as the instruction buffer with the not taken fork instructions is emptied, voltage or current compensation for the instructions in the taken fork already determined by predictor 515 may be sent to processor 560.

Figure 6:
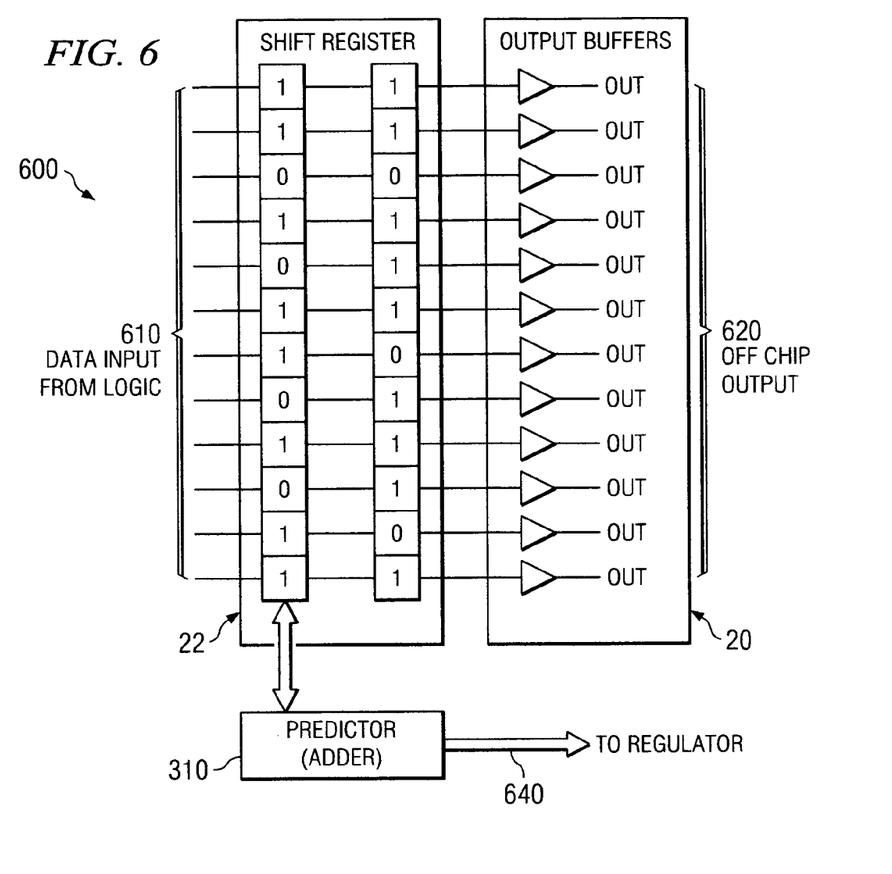
FIG. 6 is a block diagram of output buffer compensation device in accordance with some embodiments of the invention.

Prediction of the next switching state of the I/O buffer circuitry to allow determination of the voltage or current compensation for the voltage bounce associated with I/O switching will be described with reference to FIG. 6. As mentioned above, voltage bounce on the power and ground planes may also be caused by the switching of high speed I/O buffer circuitry. The I/O buffer circuitry sends and receives signals to and from other integrated circuit system devices on a circuit board. The buffer circuitry should be able to switch from binary one to zero and binary zero to one at very high speeds. As the switching speed is increased more and more by increasing the clock speed and transition rate capability of the I/O buffer circuitry, more voltage bounce is generated.

Prediction of the next bit value (i.e. one or zero) of the I/O buffer circuitry using hardware 600 may minimize voltage bounce. If the next bit value of the I/O buffer circuitry can be determined, then the appropriate voltage or current compensation may be output by a voltage or current smoothing device at the proper time to cancel the voltage bounce. As mentioned above, instructions executed by the logic device can switch the I/O buffer circuitry from binary one to zero and binary zero to one. For example, if the I/O buffer circuitry sends or receives data during instruction execution such as when executing a "move to memory" instruction or "load into register from memory" instruction, or when transferring data to another system component on the circuit board, the I/O buffer circuitry may switch value. Predictor 310 shown in FIG. 6 may compensate for this additional voltage bounce caused by the I/O buffer circuitry by identifying instructions that transfer data 610 to cause switching of the I/O buffer circuitry and requesting additional voltage or current compensation when these instructions execute (see FIGS. 1a-1c). A one cycle shift register 22 coupled to predictor 310 containing an adder that counts how many bits are high can provide an accurate determination of the voltage or current compensation needed from the voltage or current regulator 640 at least one clock cycle before being output. One clock cycle later, output buffers 20 coupled to the shift register 22 may then output the data 620 without causing voltage bounce on the power and ground planes and buses. A multiple clock cycle shift register may be required if the inherent delay of the voltage or current regulator 640 is more than one clock cycle. In the example shown in FIG. 6, the number of binary one bits is going from 9 bits to 8 bits. The worst case maximum voltage bounce would occur for the output going from all binary zero bits to all binary one bits or vice-versa, all binary one bits going to all binary zero bits.

Figure 7:
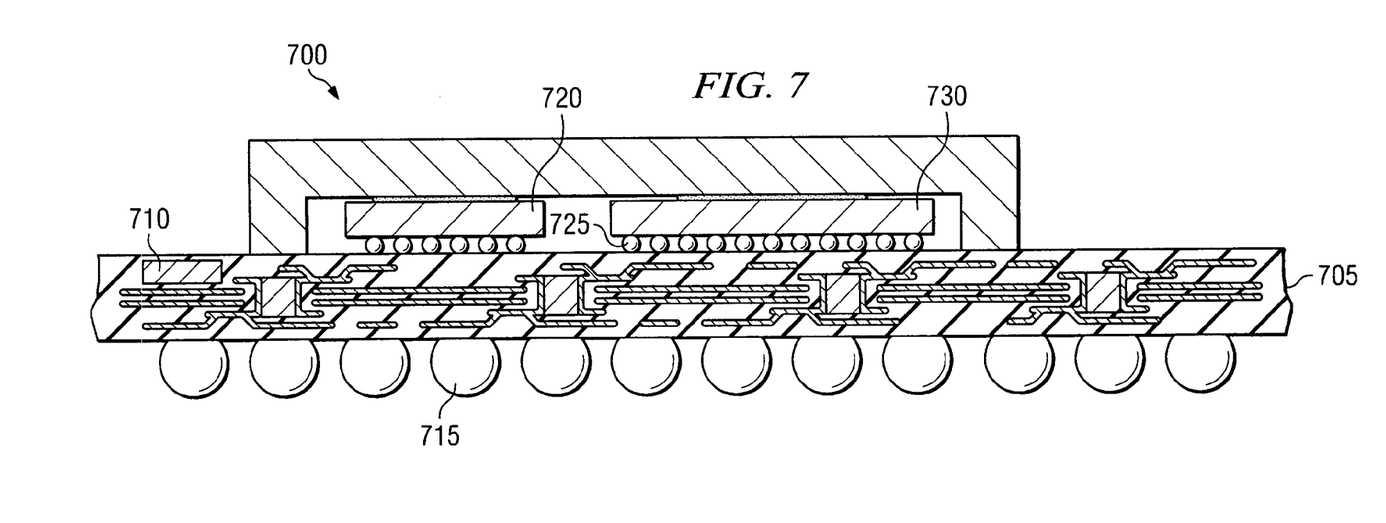
FIG. 7 is a side view drawing illustrating a logic device and voltage or current regulator in a flip chip-ball grid array (FC-BGA) package in accordance with some embodiments of the invention.

Turning now to FIG. 7, a side view drawing illustrating a logic device and voltage or current regulator in a flip chip-ball grid array (FC-BGA) package 700 is shown. In some embodiments of the invention, a voltage or current regulator device 720 may be located next to the logic device 730 in a multichip arrangement as shown in FIG. 7. In other embodiments of the invention, the voltage or current regulator device may be integrated into the same chip die as the logic device or processor 730. The voltage or current regulator device 720 and logic device 730 may be connected to the surface of substrate 705 using flip chip bumps 725. Embedded passive devices such as bypass capacitors 710 may be placed in the substrate 705 of the package 700 or on the surface of substrate 705. Solder balls 715 may attach the package 700 to a circuit board (not shown in FIG. 7).

Figure 8:
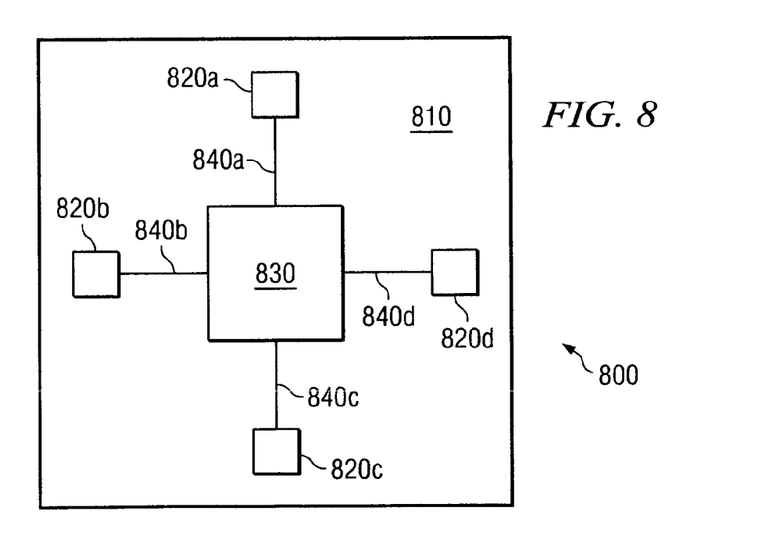
FIG. 8 is a top view drawing of a logic device connected to multiple voltage or current regulators in a FC-BGA package in accordance with some embodiments of the invention; and, FIG. 9 is a cross sectional view of a logic device in a plastic ball grid array (PBGA) package.

The voltage or current regulator device may be a single device 720 as shown in FIG. 7 connected to the logic device 730 or in an alternative embodiment as shown in FIG. 8, multiple voltage or current regulator devices may be present in the package. FIG. 8 shows a top view of a FC-BGA package 800 containing a logic device 830 adjacent to multiple voltage or current regulator devices 820a-820d. Each of the voltage or current regulator devices 820a-820d connects to the logic device 830 through respective control line 840a-840d. The control line may be a data bus which indicates how much voltage or current is needed for compensation for each switching event in sequential order. The voltage or current regulator devices may have digital-to-analog converters to transform this data into the voltage or current output to compensate for the voltage bounce on the power and ground planes and buses. Multiple voltage or current regulator devices may be used because of the electrical requirements of the substrate. Furthermore, separating power and ground planes and buses into separate sections with each section having a regulator device may result in less noise and bounce as compared to a single regulator device for the whole package.

Figure 9:
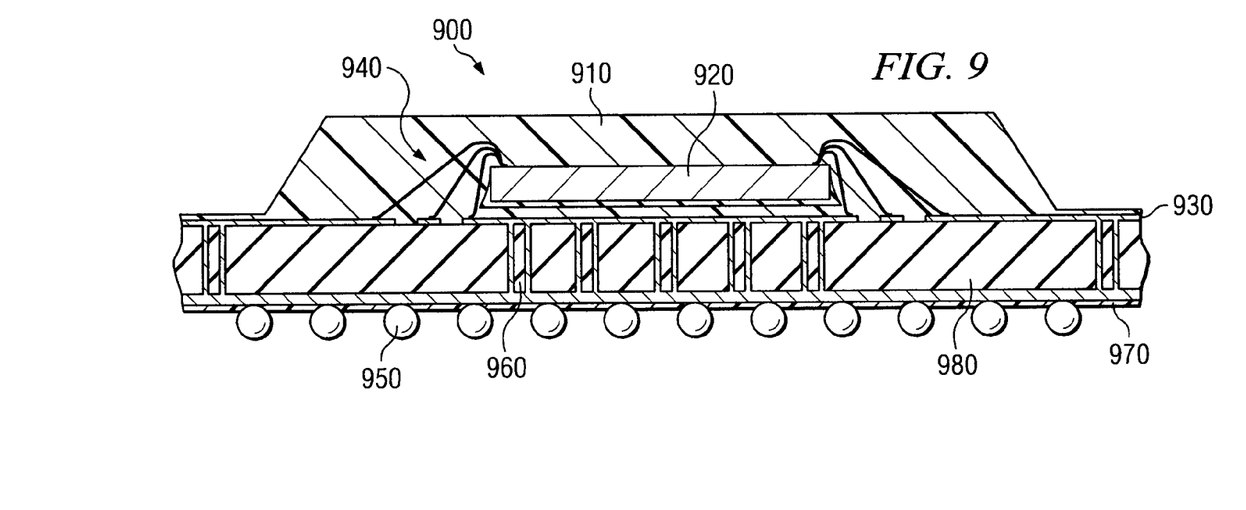

In an alternative embodiment of the invention as shown in FIG. 9, the logic device may be in a plastic ball grid array (PBGA) package 900. FIG. 9 shows a cross-sectional view of the logic device 920 in the PBGA 900. The logic device 920 is mounted on a substrate 980 using an attachment material 930. The substrate's construction is similar to a circuit board. Vias 960 or wire bonds 940 may connect the logic device to the voltage or current regulator device and other system components (not shown in FIG. 9). The vias 960 may connect the logic device 920 to the regulator device through the substrate alone. Alternatively, wire bonds 940 may connect through bond pads (not shown) at the top of the logic device to bond pads on top of the regulator device. A plastic mold compound 910 may encompass the logic device 920 on the package 900. The package 900 may have a layer of solder 970 deposited on the underside of the substrate 980 connecting the solder balls 950 to the package. The solder balls 950 may connect the package 900 to a circuit board.

While the present invention has been described with respect to a limited number of embodiments, those skilled in the art will appreciate numerous modifications and variations therefrom. Thus, in alternative embodiments as described above, the current smoothing device may be replaced by a voltage smoothing device. Thus, the regulator or power supply in the smoothing device may generate current or voltage for compensating the voltage bounce. It is intended that the appended claims cover all such modifications and variations as fall within the true spirit and scope of this present invention.

What is claimed is:

1. A method of minimizing power and ground bounce in a logic device, comprising:
    predicting from a list of instructions in a buffer a next instruction to be executed by the logic device, said logic device including power and ground planes;
    determining a current requirement of the logic device to execute the instruction including
        receiving the predicted next instruction to be executed,
        storing in a look-up table a current requirement for each of a plurality of instruction types,
        determining an instruction type of the predicted next instruction to be executed,
        finding the determined instruction type in the look-up table, and
        determining the current requirement of the instruction from the look-up table; and
    adjusting current on the power and ground planes of the logic device to the determined current requirement for executing the instruction.

2. The method of claim 1, wherein the logic device is selected from the group consisting of microprocessor, digital signal processor, programmable circuit, and Application Specific Integrated Circuit (ASIC).

3. The method of claim 1, wherein the buffer is a first-in-first-out instruction buffer.

4. The method of claim 3, wherein predicting the next instruction to be executed by the logic device includes examining instructions below the top instruction of the first-in-first-out buffer.

5. The method of claim 1, wherein adjusting the current on the power and ground planes of the logic device includes increasing the current to the determined value at start of instruction execution.

6. The method of claim 5, wherein adjusting the current on the power and ground planes of the logic device includes decreasing the current to a steady state value after completion of instruction execution.

7. A method of minimizing power and ground bounce in a logic device, comprising:
    predicting a next state of an input/output buffer circuitry in a logic device, said logic device including power and ground planes;
    determining a current requirement of the logic device to switch the input/output buffer circuitry to its next state including
        determining a number of logical high bits in the next state of the input/output buffer,
        determining the current requirement from the number of logical high bits in the next state of the input/output buffer; and
    adjusting current on the power and ground planes of the logic device to the determined current requirement for switching the input/output buffer circuitry to its next state.

8. The method of claim 7, wherein the logic device is selected from the group consisting of microprocessor, digital signal processor, programmable circuit, and Application Specific Integrated Circuit (ASIC).

9. The method of claim 7, wherein adjusting the current on the power and ground planes of the logic device includes increasing or decreasing the current to the determined value at start of the input/output buffer circuitry switching to its next state.

10. The method of claim 9, wherein adjusting the current on the power and ground planes of the logic device includes holding the current at a steady state value after the input/output buffer circuitry has completed switching to its next state.

11. An apparatus to minimize power and ground bounce in a logic device, comprising:
    at least one instruction buffer;
    a predictor coupled to said at least one instruction buffer, wherein the predictor determines adjusted current for instructions in the instruction buffer(s), said predictor including
        an instruction scanner device,
        a look-up table connected to the instruction scanner device, said look-up table receiving instructions from the instruction scanner and determining current compensation for each instruction,
        a current scheduling buffer coupled to the look-up table, said current scheduling buffer including current compensation and time at which the current compensation should be requested from the current smoothing device; and
    a current smoothing device connected to the predictor, said current smoothing device operatively arranged to provide adjusted current to power and ground planes of the logic device.

12. The apparatus of claim 11, wherein the logic device is selected from the group consisting of microprocessor, digital signal processor, programmable circuit, and Application Specific Integrated Circuit (ASIC).

13. The apparatus of claim 11, wherein the logic device is contained in a package.

14. The apparatus of claim 13, wherein the package is a flip chip-ball grid array package.

15. The apparatus of claim 13, wherein the package is a plastic ball grid array package.

16. The apparatus of claim 11 wherein the current smoothing device comprises:
    at least one current regulator, said current regulators adjacent the logic device in the package; and
    a direct current (DC) power supply connected to said at least one current regulator.

17. The apparatus of claim 11 wherein the current smoothing device is a variable current power supply.

18. The apparatus of claim 11, wherein the look-up table provides the current compensation to the current scheduling buffer.

19. The apparatus of claim 11, wherein the instruction scanner device determines the next instruction to be executed.

20. An apparatus to minimize power and ground bounce in a logic device, comprising:
    input/output buffer circuitry;
    a data storage device connected to the input/output buffer circuitry;
    a predictor connected to the data storage device operable to
        determine a number of logical high bits in the next state of the input/output buffer,
        determine the current requirement from the number of logical high bits in the next state of the input/output buffer; and
    a current smoothing device connected to the predictor, said current smoothing device outputting adjusted current to power and ground planes of the logic device dependent upon said determined current requirement.

21. The apparatus of claim 20, wherein the logic device is selected from the group consisting of microprocessor, digital signal processor, programmable circuit, and Application Specific Integrated Circuit (ASIC).

22. The apparatus of claim 20, wherein the logic device is contained in a package.

23. The apparatus of claim 22, wherein the package is a flip chip-ball grid array package.

24. The apparatus of claim 22, wherein the package is a plastic ball grid array package.

25. The apparatus of claim 20, wherein the current smoothing device comprises:
    at least one current regulator, said at least one current regulator adjacent the logic device in the package; and
    a direct current (DC) power supply connected to the current regulator(s).

26. The apparatus of claim 20, wherein the current smoothing device is a variable current power supply.

27. The apparatus of claim 20, wherein the data storage device is a shift register.

28. An apparatus to minimize power and ground bounce in a logic device, comprising:
    at least one instruction buffer;
    a predictor coupled to said at least one instruction buffer, wherein the predictor determines adjusted voltage for instructions in the instruction buffer(s), said predictor including
        an instruction scanner device,
        a look-up table connected to the instruction scanner device, said look-up table receiving instructions from the instruction scanner and determining voltage compensation for each instruction,
        a voltage scheduling buffer coupled to the look-up table, said voltage scheduling buffer including voltage compensation and time at which the voltage compensation should be requested; and
    a voltage smoothing device connected to the predictor, said voltage smoothing device operatively arranged to provide the adjusted voltage to power and ground planes of the logic device dependent upon said voltage compensation and said time at which the voltage compensation should be requested.

29. An apparatus to minimize power and ground bounce in a logic device, comprising:
    input/output buffer circuitry;
    a data storage device connected to the input/output buffer circuitry;
    a predictor connected to the data storage device operable to
        determine a number of logical high bits in the next state of the input/output buffer,
        determine the voltage requirement from the number of logical high bits in the next state of the input/output buffer; and
    a voltage smoothing device connected to the predictor, said voltage smoothing device outputting adjusted voltage to power and ground planes of the logic device dependent upon said determined voltage requirement.

30. An apparatus to minimize power and ground bounce in a processor, comprising:
    at least one instruction buffer;
    a predictor coupled to each of said at least one instruction buffer, wherein each predictor determines adjusted current for instructions in the instruction buffer(s), said predictor including
        an instruction scanner device,
        a look-up table connected to the instruction scanner device, said look-up table receiving instructions from the instruction scanner and determining current compensation for each instruction,
        a current scheduling buffer coupled to the look-up table, said current scheduling buffer including current compensation and time at which the current compensation should be requested from the current smoothing device;
    a current regulator coupled to the predictors, wherein the current regulator outputs clean voltage and current to power and ground planes of the processor dependent upon said current compensation and said time at which the voltage compensation should be requested; and
    a direct current (DC) power supply connected to the current regulator.

31. The apparatus of claim 30, wherein the current regulator includes a summing circuit operatively arranged to sum adjusted currents from each predictor.

32. An apparatus to minimize power and ground bounce in a processor, comprising:
    at least one instruction buffer;
    a predictor coupled to each of said at least one instruction buffer, wherein each predictor determines adjusted voltage for instructions in the instruction buffer(s), said predictor including
        an instruction scanner device,
        a look-up table connected to the instruction scanner device, said look-up table receiving instructions from the instruction scanner and determining voltage compensation for each instruction, a voltage scheduling buffer coupled to the look-up table, said voltage scheduling buffer including voltage compensation and time at which the voltage compensation should be requested;

a voltage regulator coupled to the predictors, wherein the voltage regulator outputs voltage or current fluctuations to produce noiseless voltage on the power and ground planes of the processor dependent upon said voltage compensation and said time at which the voltage compensation should be requested; and a direct current (DC) power supply connected to the voltage regulator.

33. The apparatus of claim 32, wherein the voltage regulator includes a summing circuit operatively arranged to sum adjusted voltage or current needs from each predictor.

34. A method of minimizing power and ground bounce in a logic device, comprising:

predicting from a list of instructions in a buffer a next instruction to be executed by the logic device, said logic device including power and ground planes;

determining a current requirement of the logic device to execute the instruction including receiving the predicted next instruction to be executed, storing in a look-up table a voltage requirement for each of a plurality of instruction types, determining an instruction type of the predicted next instruction to be executed, finding the determined instruction type in the look-up table, and determining the voltage requirement of the instruction from the look-up table; and adjusting voltage on the power and ground planes of the logic device to the determined voltage requirement for executing the instruction.

35. A method of minimizing power and ground bounce in a logic device, comprising:

predicting a next state of an input/output buffer circuitry in a logic device, said logic device including power and ground planes;

determining a current requirement of the logic device to switch the input/output buffer circuitry to its next state including determining a number of logical high bits in the next state of the input/output buffer, determining the voltage requirement from the number of logical high bits in the next state of the input/output buffer; and adjusting current on the power and ground planes of the logic device to the determined voltage requirement for switching the input/output buffer circuitry to its next state.

* * * * *